United States Patent [19]
Steiner

[11] Patent Number: 6,133,618
[45] Date of Patent: *Oct. 17, 2000

[54] SEMICONDUCTOR DEVICE HAVING AN ANTI-REFLECTIVE LAYER AND A METHOD OF MANUFACTURE THEREOF

[75] Inventor: Kurt G. Steiner, Orlando, Fla.

[73] Assignee: Lucent Technologies Inc., Murray Hill, N.J.

[ * ] Notice: This patent issued on a continued prosecution application filed under 37 CFR 1.53(d), and is subject to the twenty year patent term provisions of 35 U.S.C. 154(a)(2).

[21] Appl. No.: 08/907,834

[22] Filed: Aug. 14, 1997

[51] Int. Cl.$^7$ ..................................................... H01L 23/58
[52] U.S. Cl. ............................. 257/646; 257/76; 257/437
[58] Field of Search .............................. 257/629, 76, 437, 257/646; 438/636, 72

[56] References Cited

U.S. PATENT DOCUMENTS

| | | | |
|---|---|---|---|
| 4,226,898 | 10/1980 | Ovshinsky et al. | 438/485 |
| 5,015,353 | 5/1991 | Hubler et al. | 427/527 |
| 5,698,352 | 12/1997 | Ogawa et al. | 257/629 |
| 5,733,712 | 3/1998 | Tanaka et al. | 430/314 |
| 5,831,321 | 11/1998 | Nagayama | 257/412 |

*Primary Examiner*—J. Carroll

[57] ABSTRACT

The present invention, in one embodiment provides for use in a semiconductor device having a metal or dielectric layer located over a substrate material, a method of forming an anti-reflective layer on the metal layer and a semiconductor device produced by that method. The method comprises the steps of forming a dielectric layer, such as an amorphous silicon, of a predetermined thickness on the metal layer or dielectric and forming a gradient of refractive indices through at least a portion of the predetermined thickness of the dielectric layer by an oxidation process to transform the dielectric layer into an anti-reflective layer having a radiation absorption region and a radiation transmission region. In advantageous embodiments, the dielectric layer may be a substantially amorphous, non-stacked silicon layer. Additionally, the thickness of the dielectric layer may range from about 4.5 nm to about 150 nm. Moreover, in other embodiments, the method may include the step of doping the dielectric layer with a dopant, such as Boron. In one aspect of this particular embodiment, the dopant may comprise from about 0.5% to about 1.0% by weight of the dielectric layer.

8 Claims, 2 Drawing Sheets

SEMICONDUCTOR DEVICE HAVING AN ANTI-REFLECTIVE LAYER AND A METHOD OF MANUFACTURE THEREOF

TECHNICAL FIELD OF THE INVENTION

The present invention is directed, in general, to method of semiconductor fabrication, and more specifically to a method of using a hardmask to form an opening in a semiconductor substrate.

BACKGROUND OF THE INVENTION

It is well known that microcircuit fabrication requires precisely controlled quantities of impurities be introduced into very small regions of the silicon substrate, which are subsequently interconnected to create components and very large scale integration (VLSI) or ultra large scale integration (ULSI) circuits. Equally well known is that the patterns that define such regions are typically created by optical lithographic processes, which involve the use of a mask and radiation, such as ultraviolet light, electrons or x-rays, to expose a pattern in the photo resist material. The exposed patterns in the photo resist are formed when the wafer undergoes the subsequent development step, and protect the substrate regions that they cover. Locations from which photo resist has been removed can then be subjected to a variety of subsequent processing steps.

In today's sub-micron technologies, the degree of resolution that can be achieved by such lithographic processes is an important factor in consistently printing minimum size images. Thus, the fabrication of increasingly smaller features on VLSI relies on the availability of increasingly higher resolution lithography equipment or processes. This higher resolution may be achieved in several ways. For example, the illuminating wavelength can be decreased, or the numerical aperture of the system lens can be increased. The contrast of the photo resist can also be increased, by modifying the photo resist chemistry, by creating entirely new resists, or by using contrast enhancement layers, which allows a a smaller modulation transfer function to produce adequate images. Alternatively, the coherence of the optical system can be adjusted.

The degree of resolution has become even more critical in sub-micron circuits with features less than 0.5 $\mu$m. As features sizes have become smaller, difficulty in controlling the appropriate amount of photo resist exposure has increased due to stray light problems associated with patterning these smaller features. In some cases, over exposure of the desired photo resist area may occur, and in other cases, under exposure of the photo resist area may occur. In either case, critical dimension (CD) line width control becomes more difficult.

Optical lithography for deep sub-micron integrated circuits with feature sizes less than 350 nm (0.35 $\mu$m) requires shorter wavelength exposure (365 nm or 248 nm) of the photo resist materials used for defining circuits. The use of shorter wavelengths, where the photo resist material is transparent, results in a significant pattern resolution dependence on substrate reflectivity of the stray light. Accurate critical dimension (CD) line width control, therefore, requires nullifying the stray light from the reflective substrate.

To reduce the amount of stray light, organic and inorganic anti-reflective coatings (ARC)and anti-reflective layers (ARL) have been developed. The organic materials are typically spin coated onto the substrate, resulting in a planarization of previously defined circuit features. This planarization effect, however, results in significant thickness variations and difficulties in pattern transfer (i.e., etching). The inorganic ARC and ARL materials are typically silicon rich amorphous silicon-oxy-nitride deposited by plasma enhanced chemical vapor deposition using silane nitrous-oxide chemistry. While the resultant inorganic material has conformal step coverage for improved pattern transfer performance, it, as well as the organic material discussed above, contains amine groups in their matrix, which are not compatible with most deep ultraviolet (248 nm)photo resist materials.

Nevertheless, silicon rich silicon oxy-nitride thin films are gaining interest for use as an ARC for enhanced lithography performance in the I-line (365 nm) and the deep ultraviolet light regime (248 nm). These silicon oxy-nitride (SION) thin films involve basically two schemes, namely an interference scheme and a total absorbance scheme. The interference scheme uses phase shift cancellation by tuning the film thickness and optical properties so that the wave length of the reflected light is out of phase with the source light. The total absorbance scheme uses a layered film where the optical properties of the top layer are tuned to match those of the photo resist, the bottom layer's optical properties are tuned for high absorbance, and the middle layer(s) is a transition layer. The optical properties of SiON are varied by adjusting the deposition chemistry for the bottom, middle, and top layers, respectively. While these schemes can work quite well to reduce the amount of stray light, they do require extremely tight control of the deposition chemistry and resultant film thickness and thickness uniformity, all of which can be difficult to achieve.

SUMMARY OF THE INVENTION

To address the deficiencies of prior art methods, the present invention, in one embodiment provides for use in a semiconductor device having a metal or dielctric layer located over a semiconductor substrate material, a method of forming an anti-reflective layer on the metal or dielectric layer. The method comprises the steps of forming a dielectric layer of a predetermined thickness on the metal layer and forming a gradient of optical properties (refractive indices, extinction coefficient and band gap) through at least a portion of the predetermined thickness of the dielectric layer by an oxidation process to transform the dielectric layer into an anti-reflective layer having a radiation absorption region and a radiation transmission region. In advantageous embodiments, the dielectric layer may be a substantially amorphous, non-stacked silicon layer. Additionally, the thickness of the dielectric layer may range from about 4.5 nm to about 150 nm. Moreover, in other embodiments, the method may include the step of doping the dielectric layer with a dopant, such as Boron. In one aspect of this particular embodiment, the dopant may comprise from about 0.5% to about 1.0% by weight of the dielectric layer.

The step of forming the dielectric layer may include the step of depositing an amorphous dielectric layer that has an inner region adjacent the metal or dielectric layer and an outer region on which semiconductor materials may be deposited. Additionally, the step of forming a gradient includes the step of forming an inner refractive index region adjacent the metal or dielectric layer and an outer refractive index region on which semiconductor materials may be deposited wherein the outer refractive index region has an index of refraction differing from the inner refractive index region. In another aspect, the outer region may be formed in such a way that it transmits radiation and the inner region may be formed in such a way that is absorbs radiation. This particular embodiment thus provides an anti-reflective layer with a gradient that enhances pattern resolution.

In one embodiment, the step of forming an inner refractive index region includes forming refractive index region that has a refractive index of about 3.0, an extinction coefficient of about 1 and a band gap ranging from about 1 eV to about 2 eV and forming an outer refractive index region that has a refractive index of about 1.8 and a band gap that ranges from about 2 eV to about 4 eV.

In another embodiment, the oxidation process includes the step of subjecting the dielectric layer to a de-ionized water ultrasonic spray. In one aspect of this particular embodiment, the step of subjecting includes subjecting the dielectric layer under a pressure of about 20 pounds per square inch and at a temperature of about 25° C. for about 30 seconds.

In yet another embodiment, the oxidation process may include the step of subjecting the dielectric layer to an atmosphere of about 98% nitrogen and about 2% oxygen at a temperature of about 800° C. for about 20 minutes, and in yet another embodiment, the oxidation process includes the step of subjecting the dielectric layer to an atmosphere of about 88% oxygen and about 12% ozone at a temperature of about 350° C. for about 1 minute.

In another aspect, the present invention provides a semiconductor device having a substrate material with a metal or dielectric layer thereon. In one particular embodiment, the semiconductor device includes a dielectric layer of a predetermined thickness on the metal layer wherein the dielectric layer is at least partially oxidized therethrough to form a gradient of refractive indices through at least a portion of the predetermined thickness. In one advantageous embodiment, the dielectric layer is a substantially amorphous, non-stacked silicon layer and may have a thickness ranging from about 4.5 nm to about 150 nm. In yet another aspect, the dielectric layer includes doping the dielectric layer with a dopant, such as Boron. The dopant may comprise from about 0.5% to about 1.0% by weight of the dielectric layer.

In this same particular embodiment, the gradient further has a radiation absorption region and a radiation transmission region. The dielectric layer may include an inner refractive index region adjacent the metal or dielectric layer and an outer refractive index region on which semiconductor materials may be deposited, the outer refractive index region having an index of refraction differing from the inner refractive index region. In one aspect of this particular embodiment, the inner refractive index region substantially absorbs radiation passed therethrough and the outer refractive index region substantially transmits radiation therethrough.

In another embodiment, the semiconductor device further includes a photo resist material formed on the dielectric layer and the refractive index region of the outer refractive index region has a refractive index substantially similar to the photo resist material.

In one embodiment, the inner refractive index region has a refractive index of about 3.0, an extinction coefficient of about 1 and a band gap ranging from about 1 eV to about 2 eV and the outer refractive index region has a refractive index of about 1.8 and a band gap that ranges from about 2 eV to about 4 eV.

In one embodiment, the dielectric layer is oxidized with a de-ionized water ultrasonic spray, and in one particular embodiment, the dielectric layer is oxidized under a pressure of about 20 pounds per square inch and at a temperature of about 25° C. for about 30 seconds. In another embodiment, however, at least a portion of the predetermined thickness of the dielectric layer is oxidized in an atmosphere of about 98% nitrogen and about 2% oxygen at a temperature of about 800° C. for about 20 minutes, and in yet another embodiment, at least a portion of the predetermined thickness of the dielectric layer is oxidized in an atmosphere of about 88% oxygen and about 12% ozone at a temperature of about 350° C. for about 1 minute.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 1:
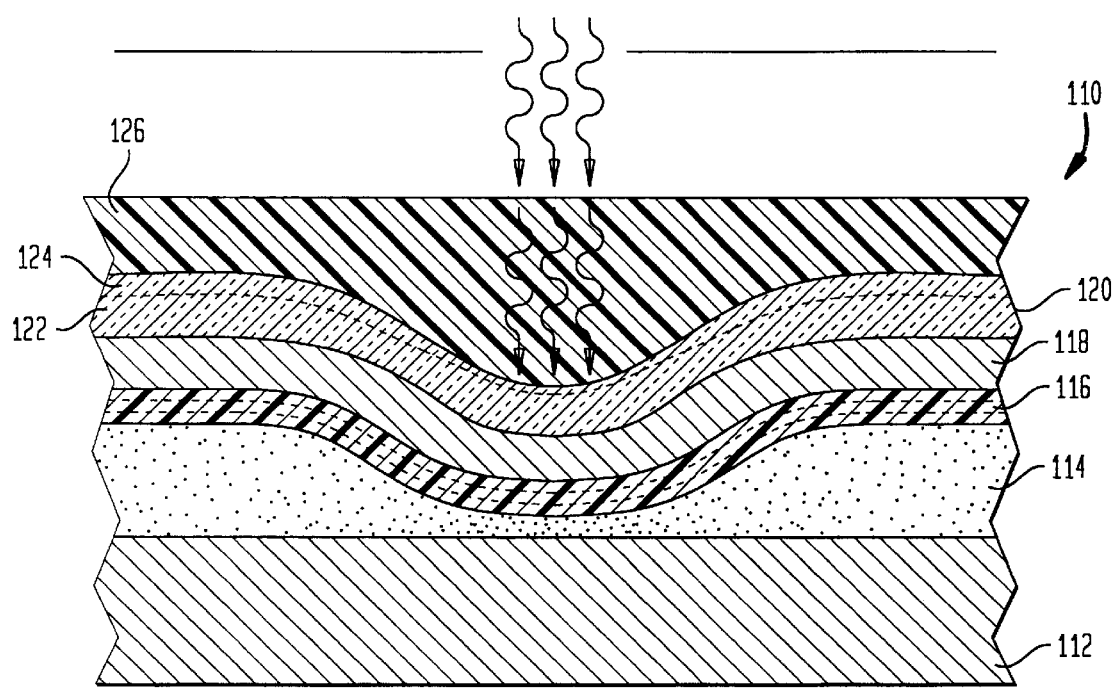
FIG. 1 illustrates a schematic cross-sectional view of a semiconductor device covered by the present invention with an anti-reflective layer deposited over the metal or dielectric layer.

Referring initially to FIG. 1, there is illustrated a schematic cross-sectional view of a semiconductor device 110 covered by the present invention. The semiconductor device 110 comprises a substrate 112 made of conventional semiconductor material such as silicon, germanium, or gallium arsenide. As is typical in such semiconductor devices, the substrate 112 is selectively doped to make particular areas conductive. A field oxide layer 114 is deposited over the substrate 112 using conventional processes and materials, and is over laid with a polysilicon layer 116. The polysilicon layer 116 may be deposited using conventional materials and deposition processes. In most applications, the polysilicon layer 116 is ultimately formed into a conventional gate typically found in such metal oxide semiconductor devices that may have a sub-micron size equal to or less than about 0.35 μm. As previously mentioned, the formation of the gate can be a very important step in the fabrication of such devices. As such, it is equally important that the etching processes that define the gate be tightly controlled. A metal layer 118, such as tungsten silicide is shown deposited over the polysilicon layer 116. As with the polysilicon layer 116, the metal layer 118 is deposited by conventional process known to those of ordinary skill in the art. Following the formation of the polysilicon and metal layers 116,118, an anti-reflective layer or coating is deposited in a manner as explained below. The phrase "anti-reflective layer" is a term known to those of ordinary skill in the art, and it is therefore understood that the layer does not reflect or absorb all radiation, but reflects or absorbs a substantial portion of the radiation associated with the exposure process of the photo resist.

In an advantageous embodiment, the anti-reflective layer or coating may be a dielectric layer 120 that is formed on the metal layer 118. The dielectric layer 120, in one particular embodiment, may be comprised of a substantially amorphous or non-crystalline, silicon, and in a further aspect, the dielectric layer 120 may be a non-stacked amorphous silicon that is formed to a predetermined thickness, which may range from about 4.5 nm to about 150 nm. The dielectric layer 120 of the present invention is non-stacked as opposed to the anti-reflective layers that are formed from conventional stacked layers of differing materials. As mentioned previously, stack schemes require extremely tight control of the deposition chemistry and resultant film thickness and thickness uniformity. With the non-stacked configuration, a film comprising a single film may be deposited as the anti-reflective layer. As such, the film thickness and thickness uniformity can be more easily controlled.

In an advantageous embodiment, the dielectric layer 120 is formed from a physical vapor deposition process under an argon or nitrogen gas flow, at about 150 watts of radio frequency power, a pressure of about 10 milliTorr, and at room temperature. The deposition rate achieved from this particular scheme is about 0.2 nm/sec that can be used to achieve a thickness ranging from about 4.5 nm to about 150 nm. The thickness of the deposited dielectric layer 120 and the subsequent oxidation, which is discussed below, is a function of the desired optical absorbance. The value of this functionality is the process latitude and longevity it affords. With small changes to deposition or oxidation time, the dielectric layer 120 can easily be tuned for specific lithography applications. Furthermore, the deposition and oxidation rates are physical constants that can be used to yield a robust and manufacturable process.

While specific parameters have been discussed above with respect to an advantageous embodiment, those skilled in the art will understand that any of the above parameters may be varied in various ways to achieve different rates of deposition and layer thickness. Furthermore, the process regime for forming the dielectric layer 120 may be quite broad and should not be limited to the particular above-discussed advantageous embodiment. For example, chemical vapor deposition (CVD) of insitu doped or undoped amorphous silicon using silane or dichloro-silane at temperatures from about 550° C. to 600° C. may be also used, as well as other deposition processes known to those skilled in the art.

The dielectric layer 120, which forms the anti-reflective layer may further include a dopant, such as Boron or some other Group III or V (previous IUPAC designation) element from the periodic chart. In an advantageous embodiment the dopant comprises from about 0.5% to about 1.0% by weight of the dielectric layer 120. The dopant enhances the oxidation rate of the dielectric layer 120.

Once the dielectric layer 120 is formed over the metal layer 118, it is then at least partially oxidized therethrough to form a gradient of refractive indices through at least a portion of the predetermined thickness. The gradient has a radiation absorption region and a radiation transmission region. During the oxidation process, the dielectric layer 120 is graded by oxidation from the top surface downward into the dielectric layer 120. The rate of oxidation may be altered by the addition of the dopant, and in a particular embodiment, the rate of oxidation increases with an increase in the percentage of dopant present in the dielectric layer 120.

In one embodiment, the oxidized dielectric layer 120 includes an inner refractive index region 122, which is that portion just below the dashed lines, adjacent the metal layer 118 and an outer refractive index region 124, which is that portion just above the dashed lines, on which semiconductor materials, such as a photo resist 126 may be deposited. In such embodiments, the outer refractive index region 124 has an index of refraction differing from the inner refractive index region 122. It should be noted that the region designations are for illustration purposes only and that the respective thicknesses of the regions may vary, depending on the application. In this particular embodiment, the inner refractive index region 122 substantially absorbs radiation passed therethrough and the outer refractive index region 124 substantially transmits the radiation therethrough. The outer refractive index region 124 may have a refractive index substantially similar to the photo resist material 126; that is, the refractive indices of these two layers are such that radiation is substantially transmitted from the photo resist 126 into the outer refractive index region 124 without substantial reflection.

For example, in one particular embodiment, the inner refractive index region 122 may have a refractive index of about 3.0, an extinction coefficient of about 1 and a band gap ranging from about 1 eV to about 2 eV and the outer refractive index region 124 may have a refractive index of about 1.8 and a band gap that ranges from about 2 to about 4 with the photo resist material 126 having a refractive index of about 1.8 as well. The refractive indices and extinction coefficient values recited above are measured at 365 nm. Those who are skilled in the art will, of course, understand that these values change depending on the wave length at which they are measured.

The method of oxidation used to form the gradient with the dielectric layer 120 may includes various methods. For example, the oxidation may be achieved by subjecting the semiconductor wafer to a de-ionized water ultrasonic spray, which in one embodiment, may include oxidizing the dielectric layer under a pressure of about 20 pounds per square inch and at a temperature of about 25° C. for about 30 seconds, or alternatively, for 20 minutes in an atmosphere of about 98% nitrogen and about 2% oxygen at a temperature of about 800° C. Another method of oxidization includes oxidizing the dielectric layer in an atmosphere of about 88% oxygen and about 12% ozone at a temperature of about 350° C. for about 1 minute. Yet another method includes oxidizing the dielectric layer by placing the semiconductor wafer on which it is deposited in de-ionized water at room temperature (i.e., ~25° C.) for about one hour. Other oxidation schemes apparent to those of ordinary skill in the art may also be used. The oxidation rate of the dielectric layer 118 may be different for each of these methods. For example, the ozone/oxygen method may have the highest rate, and the submersion in room temperature water may be the slowest. The various oxidation rates of these different methods will be useful in preparing graded films of different thickness; e.g., a thick graded film may use a faster oxidation scheme and a thinner graded film may use a slower oxidation scheme.

Figure 2:
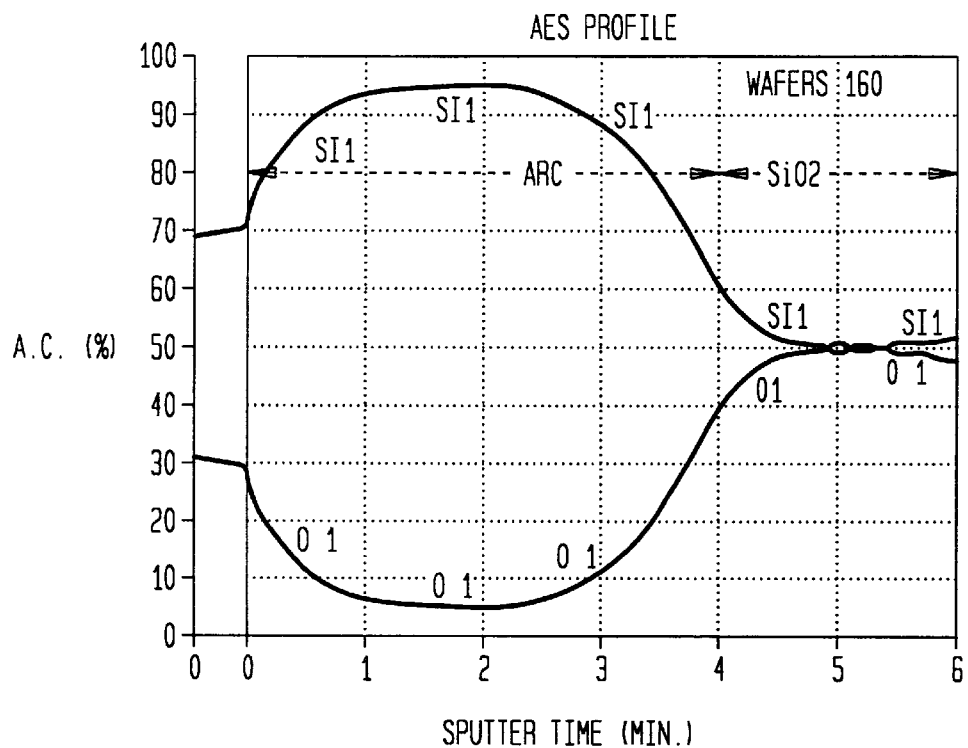
FIG. 2 illustrates a graph of an aguer electron spectroscopy (AES) profile showing the grading of the anti-reflective layer of the present inventon deposited over silicon dioxide.

Turning now to FIG. 2, there is illustrated a graph of an AES profile showing the grading of the above-discussed dielectric layer 120. In this instance, the anti-reflective layer 120 (the thickness of which is represent by the dashed "ARC" line) is an amorphous silicon that has been deposited over a typical layer of silicon dioxide using the previously-discussed physical vapor deposition method. The y-axis shows the percentage of oxygen or silicon present, and the x-axis represents sputter time in minutes, which equates to thickness of the dielectric layer. As seen from the graph, the outer or surface region of the anti-reflective layer 120 is silicon oxide, which is comprised from about 70% silicon and 30% oxygen. However, in its middle portion, the concentration of silicon increases to about 96%, while the concentration of oxygen decreases to about 4%. This indicates that the outer region is transitioning from a silicon oxide composition, which transmits the radiation to an amorphous silicon, inner region, which absorbs the radiation.

Figure 3:
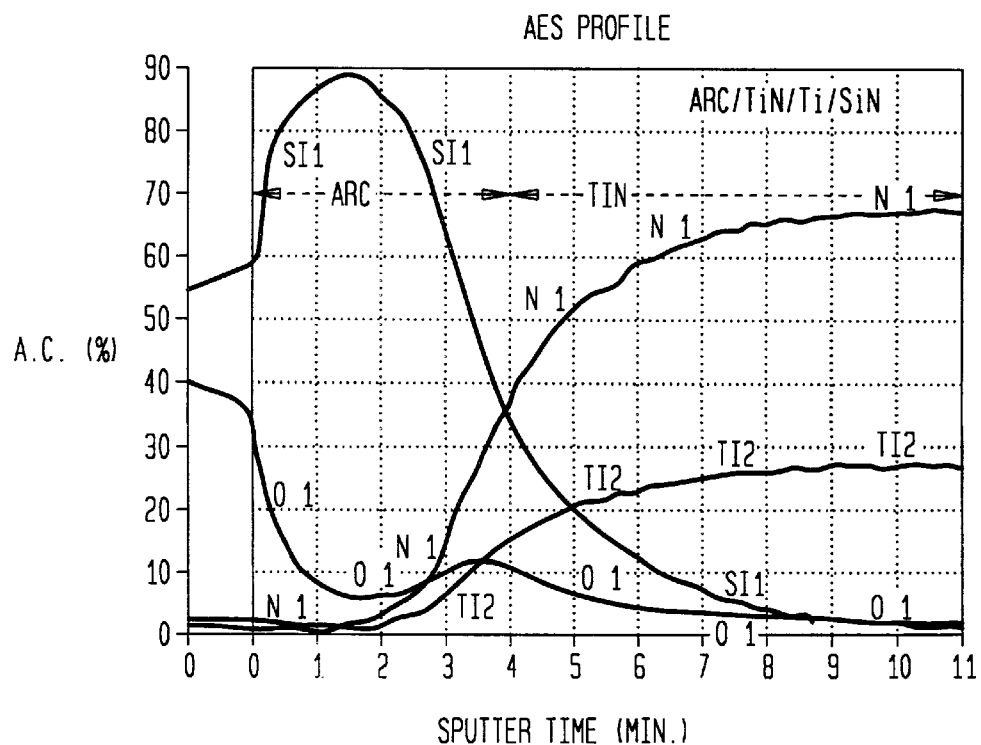
FIG. 3 illustrates a graph of an AES profile showing the grading of the anti-reflective layer of the present invention deposited over titanium nitride.

Turning now FIG. 3, there is illustrated a graph of an AES profile showing the grading of the above-discussed anti-reflective layer 120 that is deposited over a titanium nitride layer. This graph illustrates the same oxidization scheme illustrated in FIG. 2. In other words, the top or outer portion of the anti-reflective layer, in this embodiment, is comprised substantially of silicon oxide and the inner portion is comprised substantially of amorphous silicon. The optical properties of the silicon oxide portion of the anti-reflective layer are quite similar to those of the photo resist (i.e., their refractive indices are substantially similar), which allows the radiation, such as light, to traverse the interface between the photo resist and the silicon oxide and pass deeper into the non-oxidized dielectric layer (e.g., the amorphous silicon portion). The amorphous silicon portion has a very different refractive index from the silicon oxide that allows it to gradually absorb the radiation such that a substantial portion is not reflected from the underlying titanium nitride layer. Thus, this gradual transition from silicon oxide to amorphous silicon provides a graded film that can be easily tuned for excellent absorbing characteristics and enhanced lithography results.

From the foregoing, it is seen that the present invention, in advantageous embodiments, provides a method of forming an anti-reflective layer on the metal or dielectric layer and a semiconductor manufactured in accordance with that method. The method comprises the steps of forming a dielectric layer of a predetermined thickness on the metal or dielectric layer and forming a gradient of refractive indices through at least a portion of the predetermined thickness of the dielectric layer by an oxidation process to transform the dielectric layer into an anti-reflective layer having a radiation absorption region and a radiation transmission region. In advantageous embodiments, the dielectric layer may be a substantially amorphous, non-stacked silicon layer having thicknesses ranging from about 4.5 nm to about 150 nm. Moreover, in other embodiments, the method and device may include dopants formed within the dielectric layer that may comprise from about 0.5% to about 1.0% by weight of the dielectric layer.

The foregoing has outlined, rather broadly, preferred and alternative features of the present invention so that those skilled in the art may better understand the detailed description of the invention as stated herein. Moreover, those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

What is claimed is:

1. A semiconductor device having a substrate material with a metal layer thereon, comprising:

a non-stacked amorphous silicon layer of a predetermined thickness on said metal layer, said non-stacked amorphous silicon layer at least partially oxidized therethrough to form a gradient of refractive indices through at least a portion of said predetermined thickness, said non-stacked amorphous silicon layer including a dopant capable of affecting a rate of oxidation of said non-stacked amorphous silicon layer, said gradient further having a radiation absorption region and a radiation transmission region.

2. The semiconductor device as recited in claim 1 wherein said non-stacked amorphous silicon layer includes an inner refractive index region adjacent said metal layer and an outer refractive index region on which semiconductor materials may be deposited, said outer refractive index region having an index of refraction differing from said inner refractive index region.

3. The semiconductor device as recited in claim 2 wherein said inner refractive index region substantially absorbs radiation passed therethrough and said outer refractive index region substantially transmits said radiation therethrough.

4. The semiconductor device as recited in claim 1 wherein said semiconductor device further includes a photo resist material formed on said non-stacked amorphous silicon layer and said refractive index region of said outer reflective index region has a refractive index substantially similar to said photo resist material.

5. The semiconductor device as recited in claim 1 wherein said inner refractive index region has a refractive index of about 3.0, an extinction coefficient of about 1 and a band gap ranging from about 1 eV to about 2 eV and said outer refractive index region has a refractive index of about 1.8 and a band gap that ranges from about 2 eV to about 4 eV.

6. The semiconductor device as recited in claim 1 wherein said dopant comprises from about 0.5% to about 1.0% by weight of said non-stacked amorphous silicon layer.

7. The semiconductor device as recited in claim 1 wherein said dopant is Boron.

8. The semiconductor device as recited in claim 1 wherein said non-stacked amorphous dielectric layer has a thickness ranging from about 4.5 nm to about 150 nm.

* * * * *